US006748087B1

(12) United States Patent
Jones

(10) Patent No.: US 6,748,087 B1

(45) Date of Patent: *Jun. 8, 2004

(54) HEADSET WITH EAR CUSHION AND MEANS FOR LIMITING THE COMPRESSION OF THE CUSHION

(75) Inventor: Owen Jones, Ipswich (GB)

(73) Assignee: NCT Group, Inc., Westport, CT (US)

(*) Notice: Subject to any disclaimer, the term of this patent is extended or adjusted under 35 U.S.C. 154(b) by 0 days.

This patent is subject to a terminal disclaimer.

(21) Appl. No.: 09/043,273

(22) PCT Filed: Aug. 21, 1996

(86) PCT No.: PCT/GB96/02031

§ 371 (c)(1), (2), (4) Date: Mar. 5, 1998

(87) PCT Pub. No.: WO97/09850

PCT Pub. Date: Mar. 13, 1997

(30) Foreign Application Priority Data

Sep. 7, 1995 (GB) ............................................ 9518242

(51) Int. Cl.[7] ............................................ H03B 29/00

(52) U.S. Cl. ........................ 381/71.6; 381/375; 381/371

(58) Field of Search .............................. 381/71.6, 71.7, 381/71.11, 71.12, 72, 74, 370, 371, 372, 375, 376, 374, 373; 181/129–131, 134

(56) References Cited

U.S. PATENT DOCUMENTS 3,943,304 A 3/1976 Piribauer
4,455,675 A 6/1984 Bose
4,523,661 A * 6/1985 Scalzo et al. ............... 181/129
4,572,324 A * 2/1986 Fidi et al. .................... 181/129
4,644,581 A * 2/1987 Sapiejewski ................ 134/134
4,833,719 A * 5/1989 Carme et al. ............. 381/71.6
4,922,542 A * 5/1990 Sapiejewski
4,924,502 A * 5/1990 Allen et al. .................. 381/72
5,138,663 A * 8/1992 Moseley ...................... 381/71
5,148,887 A * 9/1992 Murphy ...................... 181/129
5,182,774 A * 1/1993 Bourk ........................ 379/430
5,604,813 A * 2/1997 Evans et al. ............... 381/71.6
5,675,658 A * 10/1997 Brittain ....................... 380/36
6,412,593 B1 * 7/2002 Jones ......................... 181/129

FOREIGN PATENT DOCUMENTS

| | | |
|---|---|---|
| AT | 368341 | 10/1982 |
| EP | 0 208 389 | 1/1987 |
| EP | 0 583 900 | 2/1994 |
| GB | 1 297 753 | 11/1972 |
| WO | WO 95/08907 | 3/1995 |

OTHER PUBLICATIONS

Veit I., Funkschau vol. 60, No. 23, *Electronik Kontra Larm*, Nov. 4, 1988.

* cited by examiner

*Primary Examiner*—Minsun Oh Harvey
*Assistant Examiner*—B Pendleton
(74) *Attorney, Agent, or Firm*—R. Michelle Larson

(57) ABSTRACT

An earpiece for a headset, especially a headset incorporating active unwanted noise suppression, wherein the earshell incorporates a baffle plate carrying a sound drive and an ear cushion, whereby the baffle plate also carries an upstanding projection, more especially in the form of a sound transparent dome, which limits the extent to which the cushion can be compressed when the earpiece is pressed inwardly against the ear from its normally fitted condition.

19 Claims, 4 Drawing Sheets

HEADSET WITH EAR CUSHION AND MEANS FOR LIMITING THE COMPRESSION OF THE CUSHION

BACKGROUND OF THE INVENTION

1. Field of the Invention

The present invention relates to headsets, and more particularly but not exclusively to headsets utilizing active noise cancellation.

2. Description of the Related Art

Conventionally, passive headsets comprise a pair of earpieces coupled by a resilient headband. An annular foam pad attached to each earpiece forms a cushion between the shell of the earpiece and the user's head. The resilient headband presses the earpieces against the user's head. Ambient sound is attenuated before it reaches the wearer's ear by occlusion of sound by the earpieces and absorption of transmitted sound by materials within the earpieces. The degree of attenuation achieved depends upon the nature of the ambient noise and the qualities and characteristics of the individual headset.

In various applications, however, passive attenuation is insufficient. Some environments are simply too noisy for comfort or even safety with only passive earpieces. In other environments, the elimination of extraneous noise is paramount, and satisfactory results cannot be achieved using passive means. Although the amplitude of the extraneous noise may be significantly diminished, it is almost impossible to completely isolate the wearer from extraneous noise using passive means. In addition, passive earpieces attenuate all sound, regardless of whether the wearer needs or wants to hear particular sounds.

Active noise cancellation systems eliminate unwanted sound using destructive interference. Cancellation is achieved by propagating anti-noise, identical to the unwanted soundwaves but inverted, which interacts with the unwanted waveform and results in cancellation. A feedback active cancellation headset typically includes a sound generator in each earpiece for producing anti-noise, and a residual microphone, also located in each earpiece, to provide feedback signals to a controller which generates the proper anti-noise signals. Each microphone detects the unwanted noise within each earpiece and provides corresponding signals to the controller. The controller supplies anti-noise signals to the sound generator corresponding to the noise detected in the earpieces, but inverted, with respect to the unwanted waveform. When the anti-noise interacts with the noise within each earpiece, destructive interference between the noise and the anti-noise cancels the unwanted sound.

A problem associated with feedback cancellation systems is that they are prone to instability. Feedback systems tend to become unstable, for example, if the bandwidth of the system is too broad or the gain of the system is too high. When instability occurs, the system usually emits a loud noise that is generally unpleasant and occasionally dangerous. Consequently, the maximum range and effectiveness of feedback systems are limited by parameters designed to keep the feedback system stable.

To effect maximum cancellation, the waveform of the interacting anti-noise should exactly match the unwanted waveform, but should be inverted. The acoustic properties of each earpiece, however, affect the characteristics of the anti-noise waveform. The effect of the acoustic properties may be corrected by processing the residual signal according to a transfer function characteristic of the acoustic properties of the system to compensate for the effects. However, these acoustic properties of the headset are not constant under all conditions, and may vary with the force applied to the earpiece onto the user's head. When high pressure is applied to the earpiece, or when the headset is removed from the user's head, the variation of the earpiece's acoustic properties, particularly the volume and acoustic resistance, may cause instability in the feedback loop. This instability in turn, causes the control loop to generate unstable oscillations, producing unpleasant and potentially even harmful noise.

Moreover, when a headset is designed for listening to music or information broadcast over a vehicle entertainment system or the like, the audible sound is affected to some extent by conditions at the earpieces. Thus, if the volume contained between the user's ear and the earpiece is changed, for example because the user rests the side of the head against a pillow or the like, sound distortion can occur due to a change in frequency response, especially high frequency response.

SUMMARY OF THE INVENTION

The headset in accordance with the invention limits the changes in reproduction of feedback sound which can take place in an earpiece due to compression of the cushion via which the earpiece is pressed against the user's ear.

Thus, according to one aspect of the invention, there is provided a headset comprising an earpiece adapted to be held against the ear of the user, said earpiece comprising:

an earpiece shell;

a baffle plate incorporated in the earpiece shell;

a sound generator carried by the baffle plate; and a cushion carried by the earpiece shell and via which the earpiece is adapted to be held against the ear;

wherein the baffle plate carries means for limiting compression of the cushion against the ear.

When the headset is receiving music or other sound, for example from a vehicle entertainment system, compression of the earpiece cushion is restricted to minimise distortion if the cushion is compressed, for example because the user presses by hand on the earpiece or leans his or her head against a pillow.

The invention is applicable to earpieces having a cushion in the form of a cushioning ring surrounding the sound generator or drive unit, and earpieces having a cushion overlay. In the former case at least, an apertured dome may be provided above the sound generator, i.e. upstanding from the central region of the baffle plate, to restrict compression of the cushion. In the latter case, the baffle plate may carry upstanding, flat headed pins distributed over its surface which in use faces towards the ear.

The cushion compression limiting means preferably restricts compression to less than 70 per cent, preferably less than 50 per cent, for example, of the maximum cushion compressibility.

The invention is even more useful, however, in a headset providing for active noise cancellation of unwanted environmental noise.

Thus, according to another aspect of the invention, there is provided a headset for active noise cancellation of unwanted environmental noise, comprising an earpiece adapted to held against the ear, said earpiece comprising:

an earpiece shell;

a drive unit incorporated in the shell;

a microphone incorporated in the shell to detect unwanted noise and feed via an inverting amplifier a phase inverted, unwanted noise cancellation signal to the drive unit;

a cushion carried by the earpiece shell; and means for restricting compression of the cushion against the ear to the extent necessary substantially to prevent acoustic gain increasing beyond a threshold which gives rise to the generation of sound oscillations at the earpiece.

If the user acts in any manner which would normally give rise to such compression of the cushion that highly unpleasant oscillations,especially high frequency oscillations, would be heard in the ear, the cushion compression restricting means, for example an apertured dome as aforesaid or any other convenient form of upstand, restricts cushion compression to the extent necessary substantially to prevent these oscillations from developing.

The cushion restricting means, if located centrally, also presses on the ear flap (tragus) when the cushion is compressed to the maximum possible extent, to close the ear canal (crus helias) against any residual oscillatory noises which may occur.

Moreover, the headset may include cushion deforming means for causing the cushion, when held against the ear, to close any gap which would otherwise exist between the side of the head and the front of the ear forwardly of and above the ear canal.

This cushion deforming means may comprise an off-centre protrusion from the baffle plate, aligned with the gap which exists between the front of the earpiece and the side of the head when the earpiece is properly fitted by the headband, this protrusion, e.g. a generally radial ridge, being of lesser height than the upstand or upstands which restrict cushion compression.

Also, when the earpiece is properly fitted, the microphone for detecting unwanted environmental noise is preferably positioned to align with the intertragel incisure leading to the ear canal.

The invention also provides a complete headset system comprising:

an earpiece adapted by a headband to be held against the ear, said earpiece comprising:

an earpiece cup;

a drive unit carried by the cup;

a microphone carried by the cup;

an ear cushion carried by the cup; and means carried by the cup for limiting compression of the cushion against the ear;

an electronics unit, said electronics unit completing a feedback loop which includes an inverting amplifier means adapted to generate an amplified, phase inverted signal from an unwanted noise signal received from the microphone and to feed said phase inverted signal to the drive unit, the acoustic gain of the loop being increased when the earpiece cushion is compressed against the ear beyond a predetermined extent;

wherein the compression limiting means carried by the earpiece is adapted to restrict compression of the cushion not substantially to exceed said predetermined extent.

The electronics unit is preferably battery powered and mounted remotely from the headset, although this unit could be mounted on the back of the earpiece shell, optionally with the power source remotely located.

The headset system is applicable to portable personal music systems worn by an individual user, but more particularly finds use in vehicles having entertainment and/or passenger announcement systems.

Thus, still further, the invention provides, for use in a vehicle having an entertainment system and at least one passenger seat, a headset system comprising:

earpieces interconnected by a headband, whereby the earpieces are adapted to be held against the ears of a passenger in the seat, each earpiece carrying:

a sound generator for broadcasting sound transmitted as an electrical sound signal by the vehicle entertainment system;

a microphone;

an earpiece cushion; and means limiting compression of the cushion against the ear;

the system also including an electronics unit mounted to the passenger seat, said electronics unit being adapted for connection to the earpieces and including:

an input circuit for receiving the entertainment sound signal;

an inverting amplifier for receiving a signal representing unwanted noise from the microphone and for generating an amplified phase-inverted signal therefrom;

a summing circuit for summing the said entertainment signal and the phase-inverted signal; and an output circuit for leading the summed signal to the sound generators in the earpieces, thereby effectively to cancel unwanted environmental noise present at the earpieces;

wherein the cushion compression limiting means serves to limit compression of the cushion to an extent beyond which acoustic feedback from the microphones to the sound generator via the electronics unit tends to generate audible oscillations in the earpieces.

It is also conceivable that the invention may be applied to the adaptation of existing headsets which incorporate a flat baffle plate which provides no restriction for compression of the earpiece cushion.

Thus, in accordance with another aspect of the invention, there is provided, for an earpiece adapted to be held against the ear and comprising an earpiece shell, a generally flat baffle plate incorporated in the shell, a sound generator carried by the baffle plate and an earpiece cushion carried by the baffle plate; an earpiece attachment comprising an element having means of attachment to the baffle plate and an upstanding part which, when the attachment is secured to the baffle plate, serves to limit compression of the earpiece cushion.

DESCRIPTION OF EMBODIMENTS

Figure 1:
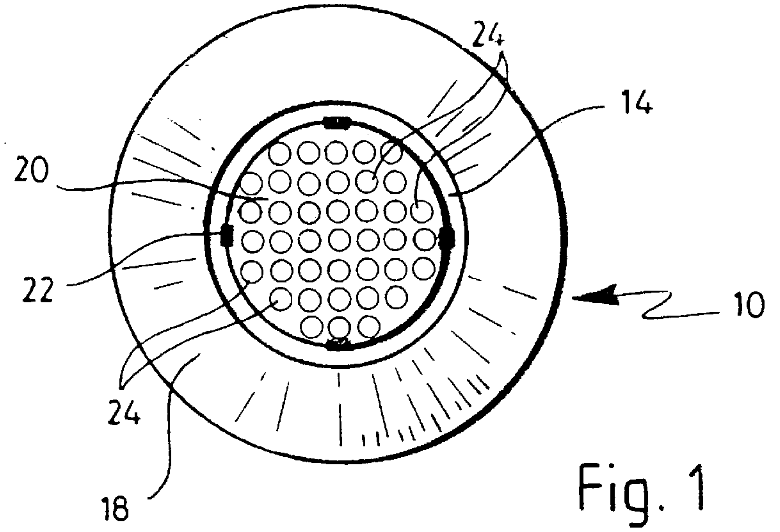
FIGS. 1 and 2 are respectively plan and side elevational diagrammatic views of an earpiece in accordance with the invention.

The performance of an active headset is limited by various factors such as the allowed complexity of the electronics, the time delay associated with the acoustics of the drive unit and microphone placement, and the variability of the acoustic environment that occurs between different users. But often dwarfing these factors is the change in the headset transfer function that occurs when the headset is pressed hard against the ear. Depending upon the exact design of the headphone cushion, the acoustic gain can increase by as much as 10–12 dB. If the electronics has been designed to extract the maximum possible cancellation out of the system under normal wearing conditions then this gain increase will cause the active headset to become grossly unstable. The result will be that the headset will squeal with high amplitude at high frequencies and motorboat at low. If this is to be avoided, the loop gain has to be cut down considerably thereby severely curtailing the available cancellation performance under normal conditions.

Previous attempts have been made to circumvent this limitation by means of automatic gain controls that sense the change in the acoustics of the headset system, or by techniques that sense the pressure applied to the headset and use this as a control signal to close down the loop gain under abnormal conditions. The problem with these techniques is one of complexity and hence expense.

The present invention overcomes these problems in a different way, by the incorporation of a structure into the headphone that limits the change that can be induced in the headset transfer function. A drawing of one preferred arrangement is shown diagrammatically in FIGS. 1 and 2. In the embodiment shown, the earpiece 10 comprises, as is normal, an earpiece cup or shell 12, a baffle plate 14 incorporated in the shell, a sound generator or drive unit 16 supported by the baffle plate, and a ring-shaped cushion 18 carried by the baffle plate. The earpiece shell also carries a microphone 19 for detecting unwanted noise.

However, in accordance with the invention, an acoustically transparent dome 20 is mounted above the central region of the baffle plate 14, above the sound generator 16, supported by means of pillars 22, which may be rigid, or possibly semi-rigid to possess a very limited amount of "give" when the earpiece is pressed hard against the ear. As shown, the dome 20 is apertured, as indicated at 24, to render it acoustically transparent.

The dome 20 is set back from the face of the non-compressed cushion so that under normal wear the dome does not come into contact with the user's ear.

However, when excess pressure is applied for any reason, e.g. the user resting the side of the head against a pillow, compression of the cushion is limited by the dome contacting the ear, incidentally pressing on the ear flap to close the ear canal, at which point any substantial further compression of the cushion is prevented, so that any further increase in loop gain in the electronics is curtailed.

The use of the dome assembly thus means that increase in loop gain can be held to the order of 2–3 dB at the lower frequencies and 5 dB at higher frequencies, thus either allowing the loop gain to be set higher and thus the effective cancellation of unwanted noise to be improved, or the complexity of the electronics reduced for a given level of unwanted noise cancellation.

Assuming that the loop gain is reduced to say 2–3 dB, there is substantially reduced risk of oscillations developing in the loop when the cushion is compressed (to the maximum permitted extent), while the effect of any residual oscillations which do occur is also reduced, as far as the user is concerned, by the closure of the ear flap.

Figure 2:
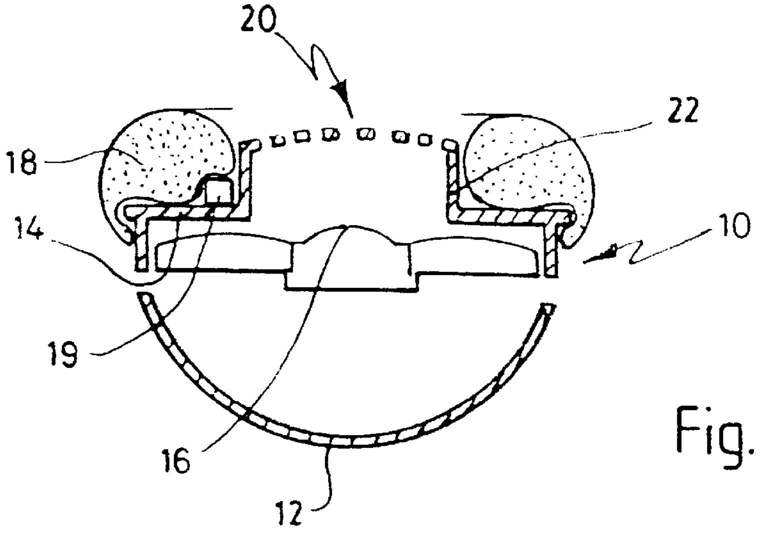
Figure 3:
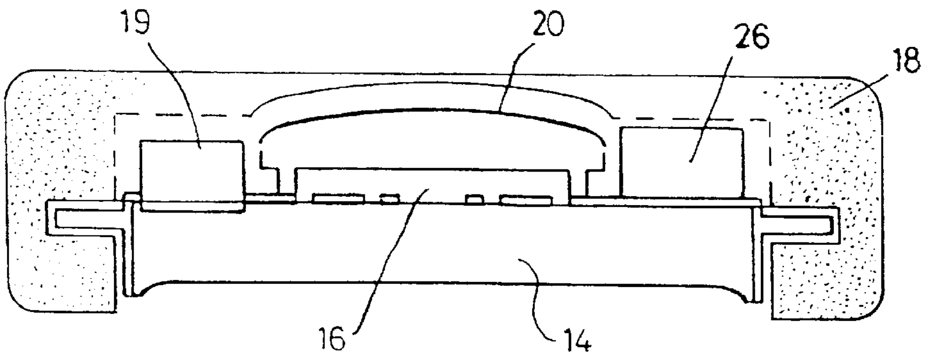
FIG. 3 is a side elevational view of a preferred embodiment.

FIG. 3 shows a preferred embodiment of earpiece in accordance with the invention, wherein the same reference numerals as in FIGS. 1 and 2 are used for similar parts. The preferred embodiment incorporates a protrusion 26 on the baffle plate 14, for a purpose to be later described. It will also be noted that the microphone 19 is recessed into the baffle plate 14, in order to reduce the height by which it stands up from the baffle plate, thus ensuring that it is able efficiently to detect unwanted noise, even when the cushion is compressed.

Figure 4:
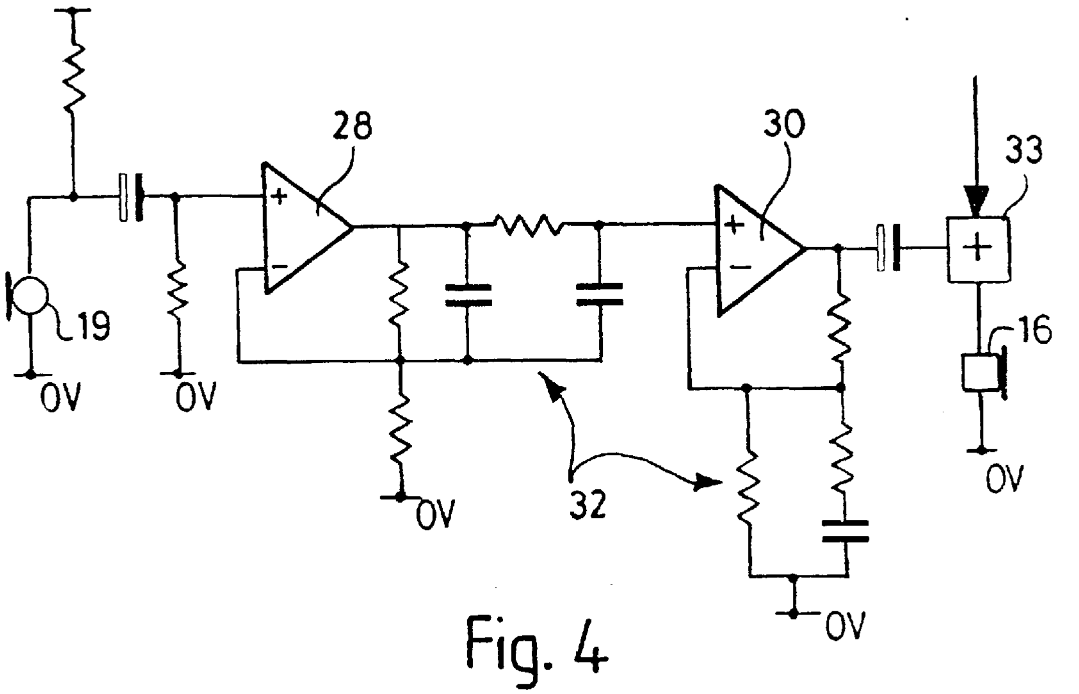
FIG. 4 is a circuit diagram of an electronics unit.

For completeness, FIG. 4 is a circuit diagram of a simple electronics unit for use with the headset. This electronics unit completes the feedback loop from the microphone 19 to the sound generator or drive unit 16, when the headset is in use.

The electronics essentially comprises a phase inverting operational amplifier 28 and a power amplifier 30 together with a number of resistors and capacitors, generally indicated by the reference 32, which serve to tailor the frequency response of the circuit. Reference 33 denotes a summing circuit at which wanted sound is introduced.

It will be understood that, when pressure on the earpiece is increased fully to compress the earpiece cushion as far as is permitted by the dome, the spatial volume in front of the drive unit 16 within the earpiece is reduced. The acoustic gain of feedback from drive unit to microphone, and that of the feedback loop as a whole, is thereby increased, not only due to this reduction in volume, but also due to increased density of the cushion material because of its compression. The presence of the central dome in the baffle limits this gain in the feedback loop.

Figure 5:
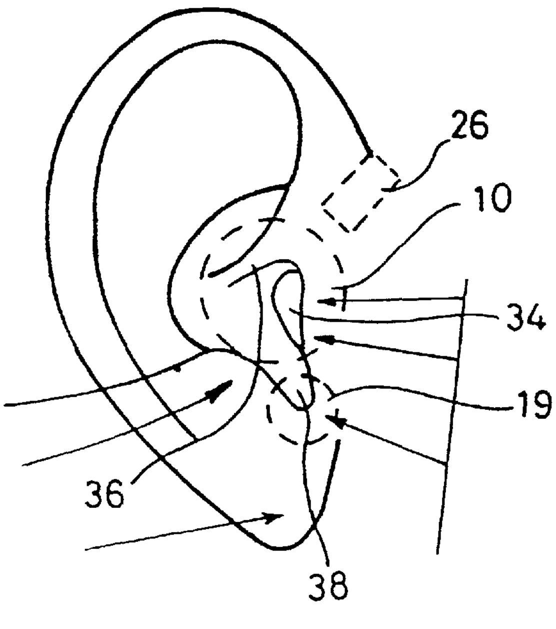
FIG. 5 is a diagram of the ear with relevant parts of the earpiece superimposed thereon.

Referring now to FIG. 5, there is shown a diagram of the ear on which have been superimposed the position of the dome 20, the microphone 19 and the protrusion 26, when the earpiece is normally fitted and held against the ear.

The dome 20, at the centre of the earpiece, is located generally at the centre of the area of the ear, and acts to close the ear flap 34 over the entrance to the ear canal 36 when the cushion is fully compressed. The microphone is located adjacent the lower end of the intertragel incisure 38 which leads to the ear canal, while the protrusion 26, which takes the form of a generally radial ridge upstanding from the baffle plate, is located at the interface between the side of the head and the front of the ear forwardly and above the entrance to the ear canal. When an earpiece is normally held against the ear, a gap usually exists, between the user's ear and the earpiece cushion, at this point. The purpose of the protrusion 26, which is of lesser height than the dome 20, is to deform the cushion outwardly so that this gap is closed, reducing penetration of unwanted environmental noise into the earpiece.

Figure 6:
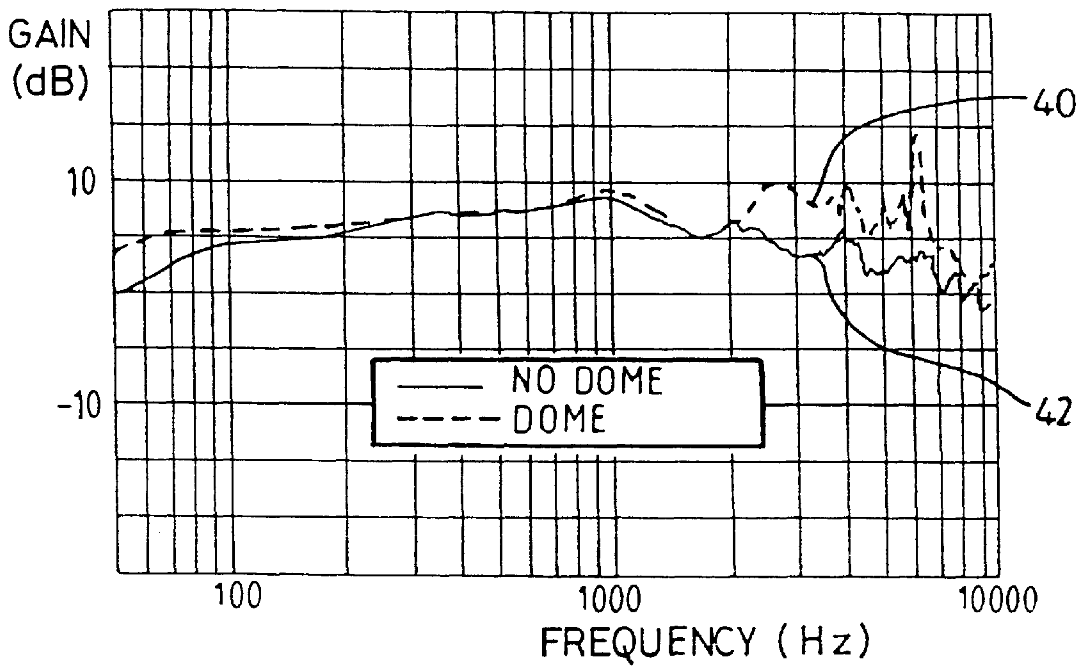
FIGS. 6 and 7 are graphs showing the in use behaviour of the earpiece in accordance with the invention.

FIG. 6 is a graph showing the acoustic gain increase under high pressure (in dB) of the earpiece of FIG. 3, with and without the dome, for a frequency range (in Hz) from 0 up to 10000 Hz. Curve 40 represents this gain increase for the earpiece without dome, and wave 42 represents the gain increase for the earpiece having the dome. The improvement effected by the presence of the dome is especially apparent at high frequencies.

Figure 7:
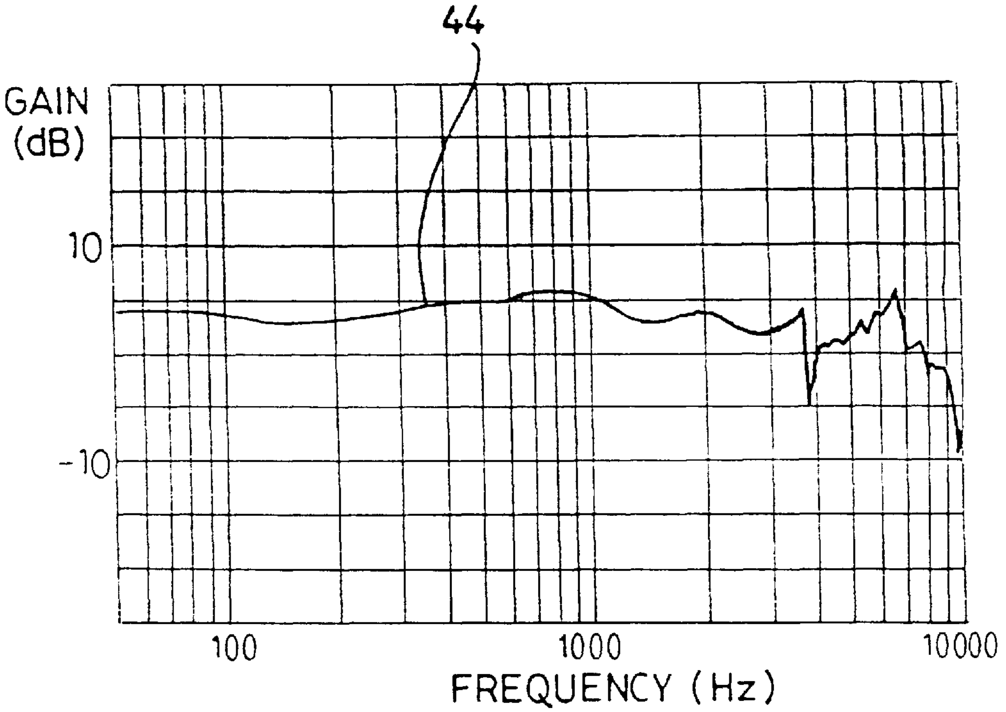

FIG. 7 is a graph showing a better optimised system employing the dome. It can be seen from FIG. 7 that the gain increase 44 is relatively low and relatively flat over a wide frequency range. The relative flatness of the wave 44 also shows that the invention is of applicability to a passive earpiece which does not incorporate active noise cancellation. Thus, assuming the passive earpiece is receiving sound transmitted by an entertainment system, e.g. from a personal entertainment set or on board a vehicle such as a car or aircraft, the earpiece with the dome exhibits a more uniform frequency response which undergoes less change when the earpiece cushion is compressed.

Figure 8:
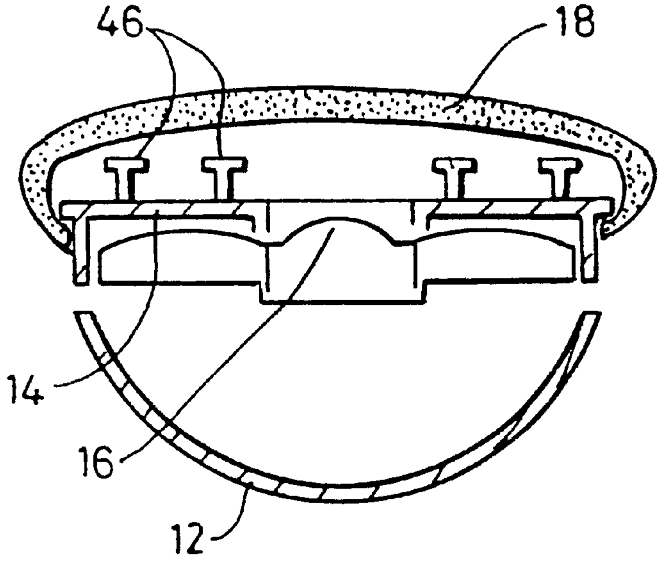
FIGS. 8 and 9 show possible modifications of the earpiece.
Figure 9:
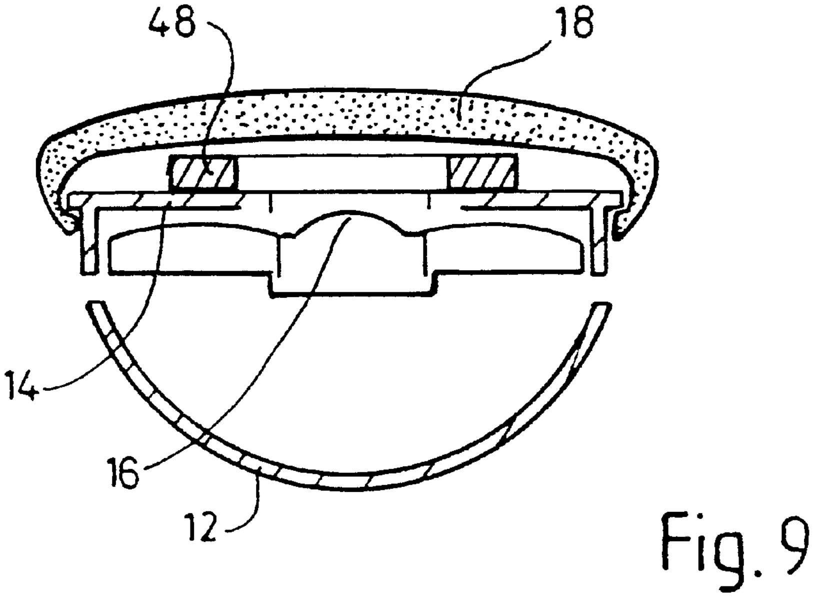

It will be appreciated that, although illustrated with respect to an earpiece having a cushioning ring, the invention is also applicable to earpieces having a cushion overlay. In this case the central dome upstanding from the baffle plate can be retained or, as indicated in FIG. 8, a number of flat headed pins 46 can be provided, upstanding from the baffle plate in distributed relationship. In fact, in general, it will be appreciated that any form of upstand from the baffle plate, which effectively limits compression of the earpiece cushion, preferably to less than 50% of the normally available compression, can be employed. Thus, FIG. 9 shows. another modification in which an annular upstand 48 is employed, additionally to or in place of the dome.

Various other modifications are possible within the spirit and scope of the invention which has been hereinbefore described and illustrated.

What is claimed is

1. A headset for active noise cancellation of unwanted environmental noise, comprising an earpiece adapted to be held against the ear, said earpiece comprising:

an earpiece shell;

a drive unit incorporated in the shell;

a microphone incorporated in the shell to detect unwanted noise and feed via an inverting amplifier a phase inverted, unwanted noise cancellation signal to the drive unit; and a cushion carried by the earpiece shell;

an electronics unit, said electronics unit completing a feedback loop which includes an inverting amplifier means adapted to generate an amplified, phase inverted signal from an unwanted noise signal received from the microphone and to feed said phase inverted signal to the drive unit, the acoustic gain of the feedback loop being increased when the earpiece cushion is compressed against the ear beyond a predetermined extent; characterised in that means are provided on the earpiece shell for restricting compression of the cushion against the ear to the extent necessary substantially to prevent acoustic gain increasing beyond a threshold which gives rise to the generation of sound oscillations at the earpiece, said compression limiting means being adapted to restrict compression of the cushion not to exceed said predetermined extent.

2. A headset according to claim 1, characterised by cushion deforming means for causing the cushion, when held against the ear, to close any gap which would otherwise exist between the side of the head and the front of the ear forwardly of and above the ear canal.

3. A headset for active noise cancellation of unwanted environmental noise, comprising an earpiece adapted to be held against the ear, said earpiece comprising:

an earpiece shell;

a drive unit incorporated in the shell;

a microphone incorporated in the shell to detect unwanted noise and feed via an inverting amplifier a phase inverted, unwanted noise cancellation signal to the drive unit; and a cushion carried by the earpiece shell;

an electronics unit, said electronics unit completing a feedback loop which includes an inverting amplifier means adapted to generate an amplified, phase inverted signal from an unwanted noise signal received from the microphone and to feed said phase inverted signal to the drive unit, the acoustic gain of the feedback loop being increased when the earpiece cushion is compressed against the ear beyond a predetermined extent; characterised in that means are provided on the earpiece shell for restricting compression of the cushion against the ear to the extent necessary substantially to prevent acoustic gain increasing beyond a threshold which gives rise to the generation of sound oscillations at the earpiece, said compression limiting means being adapted to restrict compression of the cushion not to exceed said predetermined extent, characterised by cushion deforming means for causing the cushion, when held against the ear, to close any gap which would otherwise exist between the side of the head and the front of the ear forwardly of and above the ear canal, including a baffle plate carrying the sound generator and the microphone, characterised in that the cushion deforming means comprises an off-centre upstanding protrusion from the baffle plate, so positioned around the earpiece as to align with the interface between the side of the head and the front of the ear forwardly of and above the ear canal.

4. A headset according to claim 3, characterised in that the compression restricting means comprises an upstand from the baffle plate, and the cushion deforming protrusion is of lesser height than the upstand.

5. A headset according to claim 4, characterised in that the microphone is positioned off-centre relative to the drive unit, so located around the baffle plate as to align with the intertragel incisure of the ear when the earpiece is normally held against the ear.

6. A headset comprising an earpiece adapted to be held against the ear of the user, said earpiece comprising:

an earpiece shell;

a baffle plate carried by the earpiece shell;

a sound generator centrally carried by the baffle plate; and a cushion carried by the earpiece; characterised by an off-centre microphone carried by the baffle plate in a position therearound to align with the intertragel incisure of the ear when the earpiece is normally held against the ear, said microphone in use supplying via a feedback loop a phase inverted signal representing unwanted environmental noise to the sound generator; and means restricting compression of the cushion against the ear substantially to prevent development of oscillations in the feedback loop.

7. A headset according to claim 6, characterised in that the cushion comprises a cushion overlay for the earpiece shell.

8. A headset according to claim 6, characterised in that the cushion comprises a cushioning ring surrounding the sound generator.

9. A headset comprising an earpiece adapted to be held against the ear of the user, said earpiece comprising:

an earpiece shell;

a baffle plate carried by the earpiece shell;

a sound generator centrally carried by the baffle plate; and a cushion carried by the earpiece; characterised by an off-centre microphone carried by the baffle plate in a position therearound to align with the intertragel incisure of the ear when the earpiece is normally held against the ear, said microphone in use supplying via a feedback loop a phase inverted signal representing unwanted environmental noise to the sound generator; and means restricting compression of the cushion against the ear substantially to prevent development of oscillations in the feedback loop characterised in that the compression restricting means comprises at least one projection upstanding from the baffle plate.

10. A headset comprising an earpiece adapted to be held against the ear of the user, said earpiece comprising:

an earpiece shell;

a baffle plate carried by the earpiece shell;

a sound generator centrally carried by the baffle plate; and a cushion carried by the earpiece; characterised by an off-centre microphone carried by the baffle plate in a position therearound to align with the intertragel incisure of the ear when the earpiece is normally held against the ear, said microphone in use supplying via a feedback loop a phase inverted signal representing unwanted environmental noise to the sound generator; and means restricting compression of the cushion against the ear substantially to prevent development of oscillations in the feedback loop, characterised in that the compression restricting means comprises at least one projection upstanding from the baffle plate and characterised in that the at least one projection comprises an apertured dome positioned centrally on the baffle plate above the sound generator.

11. A headset comprising an earpiece adapted to be held against the ear of the user, said earpiece comprising:

an earpiece shell;

a baffle plate carried by the earpiece shell;

a sound generator centrally carried by the baffle plate; and a cushion carried by the earpiece; characterised by an off-centre microphone carried by the baffle plate in a position therearound to align with the intertragel incisure of the ear when the earpiece is normally held against the ear, said microphone in use supplying via a feedback loop a phase inverted signal representing unwanted environmental noise to the sound generator; and means restricting compression of the cushion against the ear substantially to prevent development of oscillations in the feedback loop, characterised by an off-centre upstanding protrusion on the baffle plate for aligning with a gap which can exist between the cushion and the ear at the side of the head and the front of the ear forwardly of and above the ear canal, thereby to deform the cushion in order to close said gap.

12. A headset system comprising:

an earpiece adapted by a headband to be held against the ear, said earpiece comprising:

an earpiece cup;

a drive unit carried by the cup;

a microphone carried by the cup; and an ear cushion carried by the cup; characterised by means carried by the cup for limiting compression of the cushion against the ear; and an electronics unit, said electronics unit completing a feedback loop which includes an inverting amplifier means adapted to generate an amplified, phase inverted signal from an unwanted noise signal received from the microphone and to feed said phase inverted signal to the drive unit, an acoustic gain of the feedback loop being increased when the earpiece cushion is compressed against the ear beyond a predetermined extent;

wherein the compression limiting means carried by the earpiece is adapted to restrict compression of the cushion not substantially to exceed said predetermined extent.

13. A headset system according to claim 12, characterised in that the electronics unit is battery powered.

14. A headset system according to claim 12, characterised in that the electronics unit is positioned remotely from the earpiece.

15. A headset system according to claim 12, characterised in that the electronics unit is incorporated in the back of the earpiece cup.

16. A headset system according to claim 12, characterised by a baffle plate incorporated in the earpiece cup, the baffle plate carrying the drive unit, microphone and cushion compression limiting means.

17. A headset system comprising:

an earpiece adapted by a headband to be held against the ear, said earpiece comprising:

an earpiece cup;

a drive unit carried by the cup;

a microphone carried by the cup; and an ear cushion carried by the cup; characterised by means carried by the cup for limiting compression of the cushion against the ear; and an electronics unit, said electronics unit completing a feedback loop which includes an inverting amplifier means adapted to generate an amplified, phase inverted signal from an unwanted noise signal received from the microphone and to feed said phase inverted signal to the drive unit, an acoustic gain of the feedback loop being increased when the earpiece cushion is compressed against the ear beyond a predetermined extent;

wherein the compression limiting means carried by the earpiece is adapted to restrict compression of the cushion not substantially to exceed said predetermined extent characterised by a baffle plate incorporated in the earpiece cup, the baffle plate carrying the drive unit, microphone and cushion compression limiting means characterised in that the cushion compression limiting means comprises an apertured upstand projecting from the baffle plate.

18. A headset system according to claim 17, characterised in that the apertured upstand comprises an apertured dome integrally formed with the baffle plate.

19. A headset system according to claim 17, characterised in that the apertured upstand is adapted to fit detachably to the baffle plate.

* * * * *